United States Patent [19]
Brooks

[11] Patent Number: 6,104,198
[45] Date of Patent: Aug. 15, 2000

[54] TESTING THE INTEGRITY OF AN ELECTRICAL CONNECTION TO A DEVICE USING AN ONBOARD CONTROLLABLE SIGNAL SOURCE

[75] Inventor: Leslie Mayes Brooks, Lilburn, Ga.

[73] Assignee: ZEN Licensing Group LLP, Atlanta, Ga.

[21] Appl. No.: 09/021,202

[22] Filed: Feb. 10, 1998

Related U.S. Application Data

[60] Provisional application No. 60/047,143, May 20, 1997.

[51] Int. Cl.[7] .................................................. G01R 31/02
[52] U.S. Cl. .......................................... 324/538; 324/758
[58] Field of Search .................................. 324/538, 537, 324/522, 523, 754, 756, 758, 765, 158.1

[56] References Cited

U.S. PATENT DOCUMENTS

| | | | |
|---|---|---|---|
| 3,590,378 | 6/1971 | Kassabgi ................................. | 324/537 |
| 3,825,824 | 7/1974 | Herron et al. . | |
| 3,870,953 | 3/1975 | Boatman et al. . | |
| 4,196,386 | 4/1980 | Phelps . | |
| 4,894,605 | 1/1990 | Ringleb et al. ......................... | 324/537 |
| 4,961,053 | 10/1990 | Krug ....................................... | 324/537 |
| 5,124,660 | 6/1992 | Cilingiroglu . | |
| 5,254,953 | 10/1993 | Crook et al. . | |
| 5,391,993 | 2/1995 | Khazam et al. ......................... | 324/684 |
| 5,420,500 | 5/1995 | Kerschner .............................. | 324/530 |
| 5,457,400 | 10/1995 | Ahmad et al. ........................... | 324/763 |
| 5,498,964 | 3/1996 | Kerschner et al. ..................... | 324/530 |
| 5,557,209 | 9/1996 | Crook et al. . | |
| 5,623,211 | 4/1997 | Lee . | |
| 5,712,570 | 1/1998 | Heo et al. . | |
| 5,786,697 | 7/1998 | Khazam et al. ......................... | 324/537 |
| 5,811,980 | 9/1998 | Doyle et al. ............................ | 324/758 |
| 5,831,918 | 11/1998 | Merritt et al. .......................... | 365/201 |

FOREIGN PATENT DOCUMENTS 2 143 954  2/1985  United Kingdom .

OTHER PUBLICATIONS

GenRad, Title "Junction Xpress™ A New Wave in Opens Detection", 2 pages. no date.
Hewlett Packard, Title "Reducing Process Defect Escapes with Vectorless Test", pp. 1–5. No date.
Hewlett Packard, Title "HP TestJet Technology for the HP 3070 Board Test Family", 1993, 5 pgs. (no month available).
Hewlett Packard, Title "HP 3070 Family Test Fixture Product Catalog", 1994, 3 pages.
Hewlett Packard, Title "The Complete Vectorless Test Solution", 1996, 4 pgs. (no month available).

Primary Examiner—Josie Ballato
Assistant Examiner—T. R. Sundaram
Attorney, Agent, or Firm—Troutman Sanders LLP; Wm. Brook Lafferty

[57] ABSTRACT

An apparatus and method for testing the integrity of an electrical connection (222) to a device (205) using an onboard controllable signal source (300). The onboard controllable signal source provides a test signal output (310) via an electrical signal path (305) without having to directly probe the signal path or the electrical connection. The test signal has a selectable frequency that can be selected to be harmonically unrelated to any other signal from the device. A capacitive sensor (215) positioned over the device (205) and the connector (225) detects the energy of the test signal coupled through the electrical connection. The sensor compares the detected amplitude of the test signal to a threshold value and the outcome of the comparison is indicative of the integrity of the electrical connection.

19 Claims, 3 Drawing Sheets

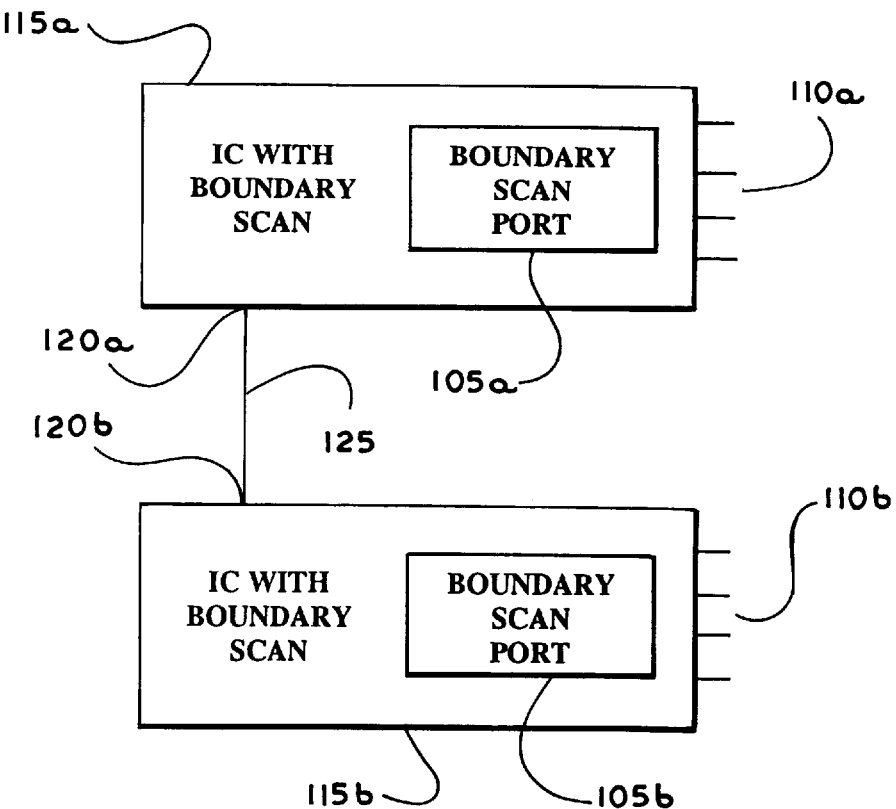
Fig_1
PRIOR ART
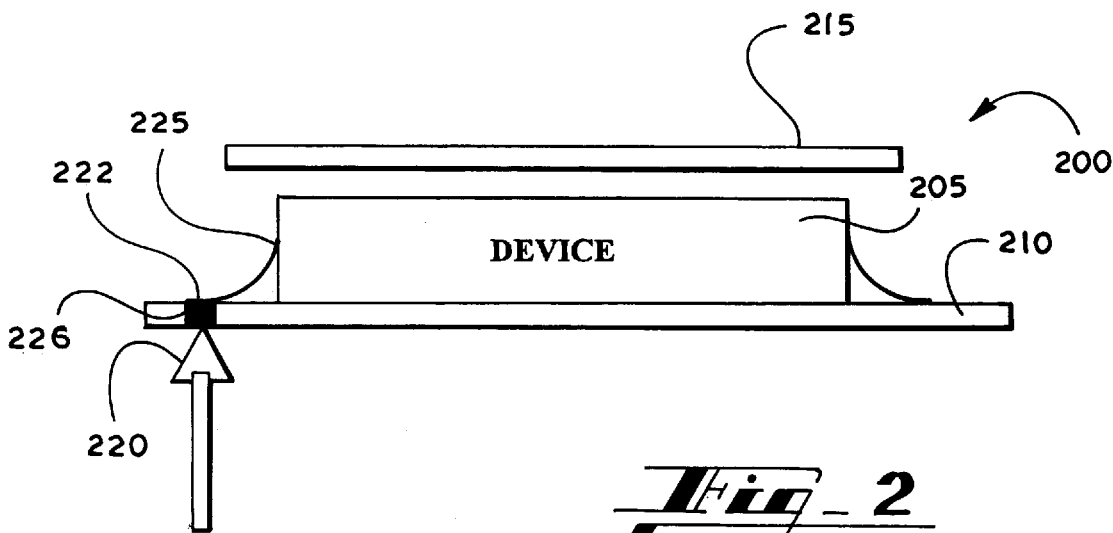
Fig_2
PRIOR ART

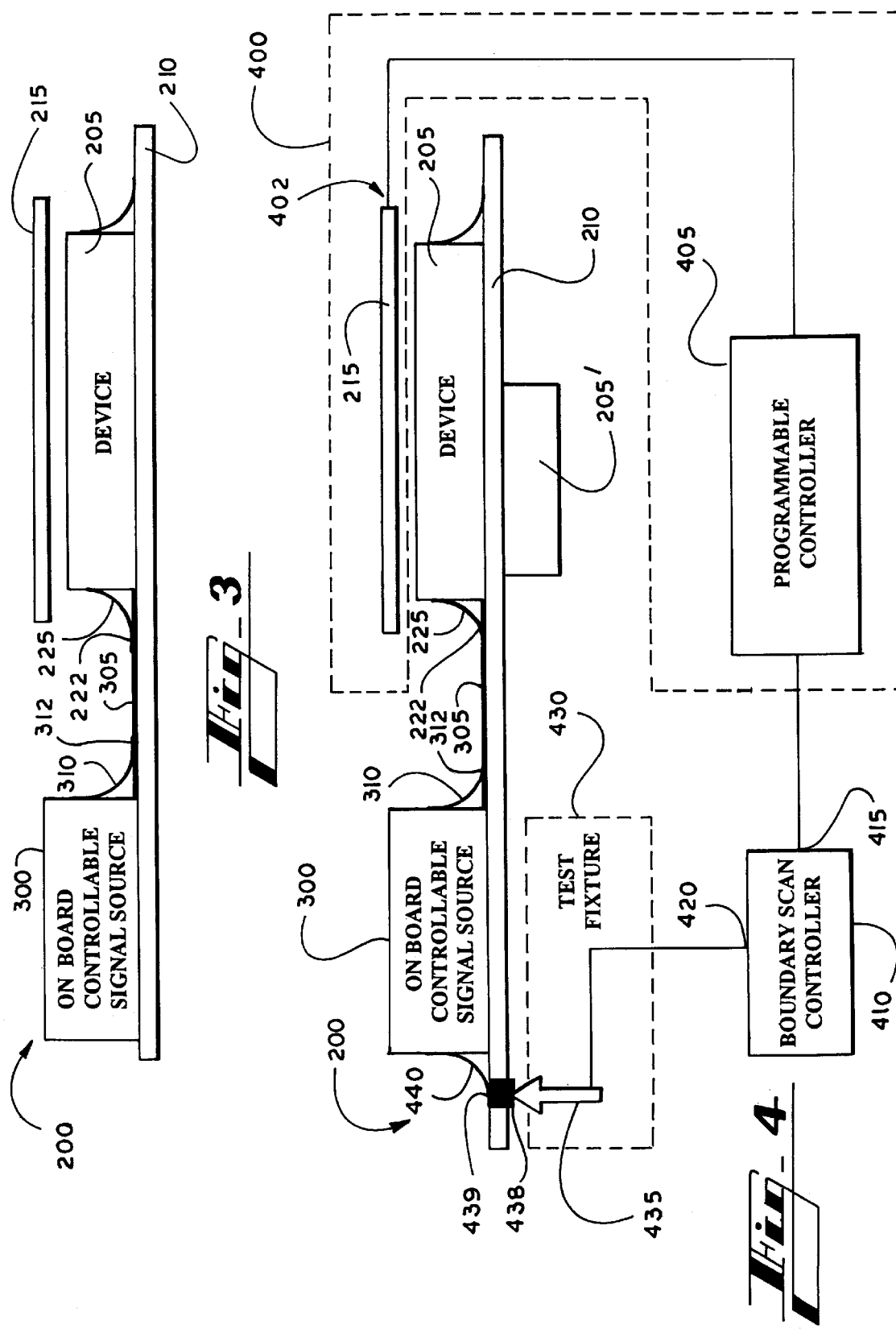

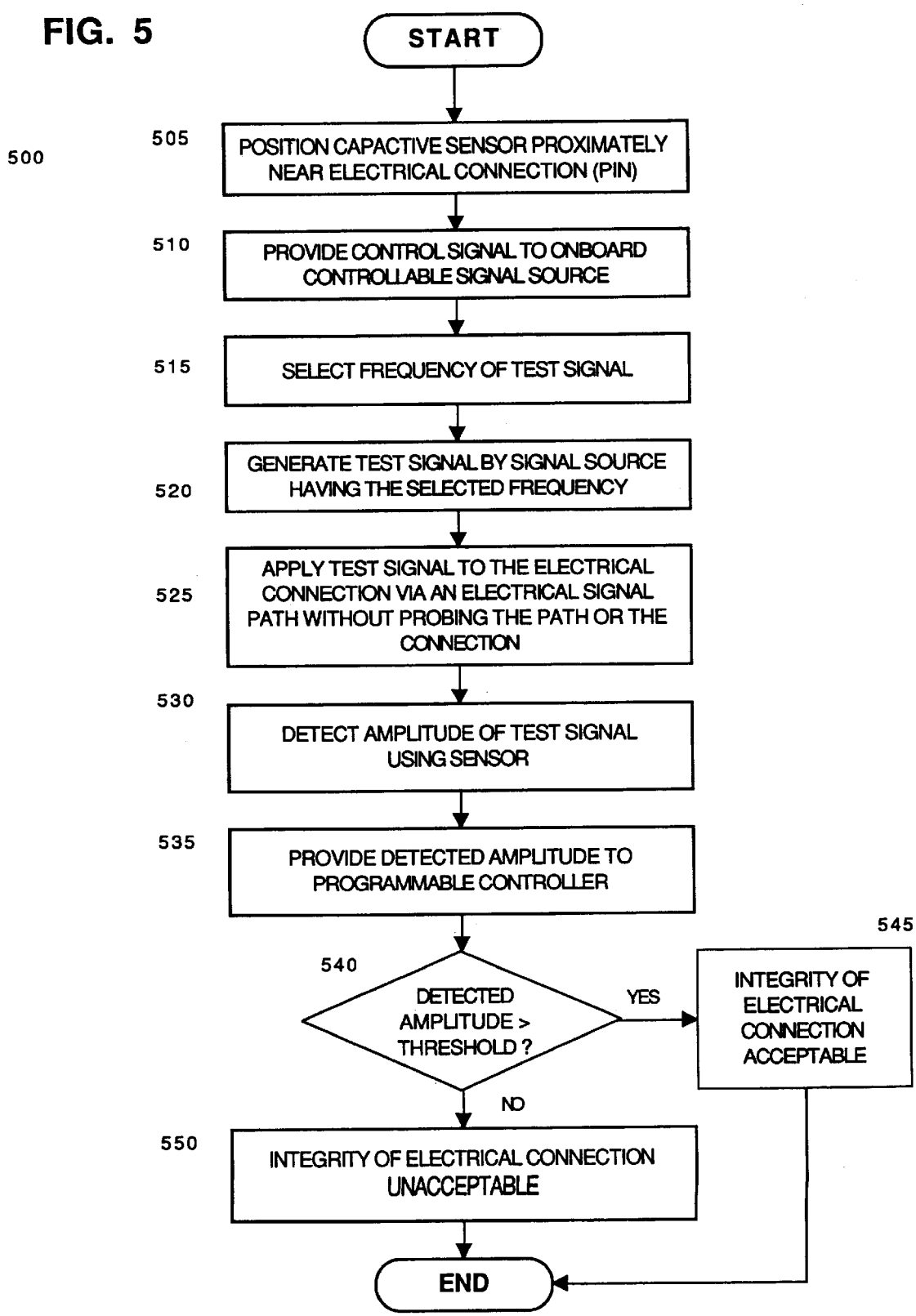

TESTING THE INTEGRITY OF AN ELECTRICAL CONNECTION TO A DEVICE USING AN ONBOARD CONTROLLABLE SIGNAL SOURCE

CLAIM TO PRIORITY

This application claims priority to U.S. Provisional Patent Application Serial No. 60/047,143 filed on May 20, 1997 entitled "Method and Apparatus for In-Circuit Testing of Circuit Boards."

TECHNICAL FIELD

This invention generally relates to in-circuit testing devices and, more particularly described, relates to testing the integrity of an electrical connection to a device mounted on a populated circuit assembly using an onboard controllable signal source.

BACKGROUND OF THE INVENTION

The world of electronics is an ever-shrinking world. The physical space needed and/or allocated to implement a given function is getting smaller and smaller. The use of dual-sided, multi-layer printed circuit boards with miniature surface mount technology (SMT) components and custom application-specific integrated circuits (ASICs) installed thereon to form small, compact, printed circuit assemblies is now common. The spacing between the pins of components becomes smaller as the designs are made to fit into smaller physical configurations. The physical spacing, such as pin spacing and wire trace spacing, is further reduced when the assembly is intended to be portable, such as a modem designed to support the Personal Computer Memory Card International Association (PCMCIA) standard.

In the context of such a crowded and densely populated printed circuit assembly, it is often difficult to determine if an electronic device or component has been installed correctly. More particularly stated, it is often difficult to determine the integrity of an electrical connection between the wire traces of the PCB and the pins or leads of the installed device or component.

One method of testing a printed circuit assembly involves use of a "bed of nails" test fixture with a conventional in-circuit tester, such as an HP 3070 Board Tester manufactured and distributed by the Hewlett-Packard Company of Palo Alto, California. The bed of nails test fixture provides a number of contact probes for accessing points on the printed circuit assembly. There must be contact between the probes of the fixture and a device on the printed circuit assembly or signal paths on the printed circuit assembly (typically via a conventional test point access node) for the test method to work. The method is often called a "bed of nails" testing method because the probes are typically sharp metal contact probes configured so that the printed circuit assembly can be placed on the "bed of nails" and tested. In this manner, the probes touch or access various parts of the device or the signal paths on the printed circuit assembly (via the test point access nodes on the printed circuit assembly) and thereby allow measurements to be made on the device.

Typically, the device is stimulated through signals provided through the probes. Measurements from the probes are then compared to "correct" values to determined if the device on the printed circuit assembly is defective. However, the appropriate signal path must be in physical contact with the test probes for this testing method to work. Densely populated printed circuit assemblies often have inaccessible signal paths, such as wire traces beneath multiple layers on the printed circuit board assembly, thereby hampering the use of such a "bed of nails" test fixture. Therefore, "bed of nails" test fixtures are often ineffective when attempting to test a densely populated printed circuit assembly.

Those skilled in the art will be familiar with Boundary Scan, which is another test method for determining if a device is defective. Boundary Scan (illustrated in FIG. 1 as prior art and also known as IEEE 1149.1 or Joint Test Action Group (JTAG)) is a specialized non-contact test method for testing the board-level interconnections among devices on a printed circuit assembly. More particularly, Boundary Scan is a special form of conventional scan path testing that is implemented around every input/output pin of a device in order to provide controllability and observability of the input/output pin values during testing.

Referring now to FIG. 1, the Boundary Scan method generally uses a set of four pins $110a$, $110b$ for each device $115a$, $115b$. These pins allow an in-circuit tester (not shown) to gain access to all of the pins on the device $115a$, $115b$. The in-circuit tester (not shown) typically sends commands to a boundary scan port $105a$ within the device $115a$ in order to read or control the input pins and the output pins on the device $115a$. Those skilled in the art will realize that while the boundary scan port $105a$ is typically implemented within the circuitry of the device $115a$, the boundary scan port $105a$ may also be implemented as a separate circuit. FIG. 1 merely shows the boundary scan ports $105a$, $105b$ implemented within the circuitry of the devices $115a$, $115b$ in order to avoid confusion.

Boundary Scan is most advantageous when a printed circuit assembly 100 has several interconnected devices $15a$, $115b$ which implement it. This is advantageous because it is then possible to use, for example, port $105a$, to generate an output on one pin $120a$ and read it from a connected pin $120b$ on another device $115b$ via, for example, port $105b$, without having physical access to either of the pins $120a$, $120b$ or the signal path 125 between the pins $120a$, $120b$. This is particularly advantageous because the same pins and signal paths which are used for Boundary Scan testing are later used to create the normal function of the circuit during normal operation. The term "normal operation" is used to describe the operation of the completed circuit assembly by the consumer or end user in the manner intended by the designer.

The digital version of Boundary Scan is more formally defined by the Institute of Electrical and Electronics Engineers, Inc. (IEEE) and the published IEEE standard 1149.1 (1990). The analog version of Boundary Scan is more currently being defined as IEEE 1149.4 (1997). Additional information regarding Boundary Scan is available by referring to the published IEEE 1149.1 standard, which is available from IEEE, Inc., New York, N.Y. Furthermore, while still not in a final form, information regarding the preliminary IEEE 1149.4 Boundary Scan standard is also available from IEEE, Inc., New York, N.Y.

While Boundary Scan testing allows testing of interconnected devices without accessing the pins of the interconnected devices, one skilled in the art will appreciate that such testing is not useful in all situations. For example, Boundary Scan testing is less useful where there is only one device implementing Boundary Scan and that device is surrounded by devices that do not implement or support Boundary Scan testing. In such a situation, it is often necessary to access many of the pins or signal paths on the printed circuit assembly with a probe. Thus, it may still be difficult to test the integrity of connections of a device on a populated printed circuit assembly using Boundary Scan.

Another non-contact testing method for testing the integrity of a device's connections is capacitive testing. An example of such capacitive testing is described in U.S. Pat. No. 5,254,953 (hereinafter "the '953 patent") entitled "Identification of Pin-Open Faults by Capacitively Coupling Through the Integrated Circuit Package" and assigned to the Hewlett-Packard Company of Palo Alto, Calif. In the '953 patent, a system is described for determining whether pins of a device are properly soldered to a printed circuit board assembly. FIG. 2 illustrates such a prior art system.

Referring now to FIG. 2, a printed circuit assembly 200 has an integrated circuit device 205 mounted to a printed circuit board 210. A capacitive sensor 215 is positioned over the device 205 while a test probe 220 contacts a pin under test 225 via a pad 226 and a connection 222 between the pin 225 and the pad 226.

In a capacitive testing process disclosed in the '953 patent, the test probe 220 typically injects an alternating current (AC) test signal (such as a 10 kHz signal at 0.2 volts) into the pad 226 connected to the pin under test 225. The capacitive sensor 215 then detects this test signal via the capacitive coupling between the pin 225 and the bottom of the capacitive sensor 215 and converts the AC signal to an intermediate signal called a detection signal. The value of the detection signal is proportional to the detected amplitude of the AC signal. In this manner, the value of the detection signal from the capacitive sensor 215 may be compared to a threshold value to determine characteristics about the detected AC signal (such as the strength of the AC signal). If the electrical connection 222 between the test probe 220, the pad 226, and the pin under test 225 is open, the value of the detection signal will be much smaller than anticipated. An in-circuit tester (not shown) connected to the capacitive sensor 215 then indicates that the printed circuit assembly 200 has failed the test and declares that the pin under test 225 is open.

While the capacitive testing process described in the '953 patent allows testing to detect open pins on populated printed circuit boards, a test probe is still required to provide the test signal. Moreover, test probe access to the pin under test must still be available for capacitive testing as described in the '953 patent to work. Such a capacitive testing process would be ineffective in a circuit assembly where test probe access to the pin under test is not available, such as a densely populated circuit assembly where the pin spacing and wire trace spacing are extremely small.

In summary, for testing the integrity of a pin of a device mounted on a populated printed circuit assembly, there is a need for a system that: (1) improves the capacitive testing method to allow testing of the integrity of the connection between the signal path and the pin without physically probing the pin; (2) allows testing without probing a signal path connected to the pin; (3) reduces the required number of test point access nodes on the printed circuit assembly; and (4) allows testing of a device's pins where there is only one device on the printed circuit assembly implementing Boundary Scan or where a Boundary Scan device is surrounded by other devices that do not implement or support Boundary Scan testing.

SUMMARY OF THE PRESENT INVENTION

The present invention satisfies the above described needs by providing an improved apparatus and improved method for testing the integrity of an electrical connection to a device mounted on a printed circuit board as part of a printed circuit board assembly by using an onboard controllable signal source. In general, the integrity of the electrical connection is determined by whether the electrical connector, such as a pin or solder pad, is properly connected to an electrical signal path on the circuit assembly. For example, the electrical connector may be properly soldered to the signal path or wire trace on the circuit assembly, i.e., a good electrical connection. However, an improperly soldered electrical connector may result in an open circuit or a short circuit on the printed circuit assembly on the device, i.e., a bad electrical connection. The present invention allows for detection of a bad electrical connection, even when there is no probe access to the connection itself or to a signal path related to the connection.

Briefly described, the present invention includes an improved apparatus comprising an onboard controllable signal source which provides an output test signal. The onboard controllable signal source is part of the printed circuit assembly and is preferably implemented as part of the normal functional circuitry of the circuit assembly. For example, the onboard controllable signal source may be a microprocessor, a microprocessor-based integrated circuit, an oscillator, or an IC supporting Boundary Scan. The onboard controllable signal source generates the test signal at a predetermined frequency. The predetermined frequency of the test signal is preferably harmonically unrelated to the frequency of any other signal associated with the device. This helps to avoid false detections and false integrity indications. An electrical signal path connects the output of the onboard controllable signal source to the electrical connection. Preferably, this signal path is the same path that implements the normal function of the device during normal operation of the circuit assembly. The onboard controllable signal source is therefore able to apply the test signal to the electrical connection without having to probe the electrical signal path or the electrical connection.

A sensor for detecting the test signal from the electrical connection is positioned proximately near the electrical connection so that sensor can detect the amplitude of the test signal passing through the electrical connection. The sensor then compares the detected amplitude to a threshold value. The comparison of the detected amplitude to the threshold value is indicative of the integrity of the electrical connection. In other words, the comparison indicates whether the electrical signal path is properly connected to the device.

The present invention also includes a more detailed improved apparatus comprising an onboard controllable signal source, an electrical signal path, and a sensor assembly for testing the integrity of an electrical connection on a device. The onboard controllable signal source provides a test signal on a test signal output of the onboard controllable signal source. The onboard controllable signal source is mounted on a populated circuit assembly having the device. The onboard controllable signal source may be implemented as a microprocessor or an oscillator, each of which is capable of generating the test signal.

The test signal generated by the onboard controllable signal source has a selectable frequency. The value of the selectable frequency is harmonically unrelated to a frequency of any other signal associated with the device.

The electrical signal path is an inaccessible signal path, such as a covered or shielded wire trace, between the output of the onboard controllable signal source and the electrical connection of the device. In this manner, the electrical signal path connects the onboard controllable signal source with the electrical connection on the device while being inaccessible to a test probe. Thus, the onboard controllable signal source is able to generate the test signal at a predetermined amplitude and to apply the test signal to the electrical connection via the electrical signal path.

In general, the sensor assembly capacitively detects the applied test signal from the electrical connection. The sensor assembly includes a sensor and a controller, such as a conventional computer used with an in-circuit tester. The sensor, preferably a capacitive sensor, is positioned proximately near the electrical connection in order to detect the amplitude of the test signal when coupled to the electrical connection. The sensor is also able to provide a detection signal to the controller indicating a detected value of the test signal's amplitude.

Once the controller has received the detection signal from the sensor, the controller is able to compare the detected value to a threshold value. This comparison is indicative of the integrity of the electrical connection. The integrity of the electrical connection is typically considered to be whether the electrical signal path, such as a wire trace on the printed circuit assembly, is properly connected to the device.

The present invention also includes an improved method for testing the integrity of an electrical connection to a device mounted on a populated circuit assembly using an onboard controllable signal source. The method preferably begins by selecting the selectable frequency of a test signal. The value of the selectable frequency depends upon the frequency of any other signal associated with the device in that the selectable frequency is harmonically unrelated to a frequency of any other signal associated with the device.

The method then includes generating the test signal having the selectable frequency by the onboard controllable signal source. Next, the test signal is applied to the electrical connection without probing an electrical signal path connected between the electrical connection and the onboard controllable signal source. The amplitude of the test signal is detected when the test signal is coupled to the electrical connection. The detected amplitude is generally referred to as a detection signal, which is then provided to a programmable controller. Finally, the value of the detection signal is compared to a threshold value. The comparison of the value of the detection signal to the threshold value is indicative of whether the electrical connection is properly connected to the electrical signal path.

Furthermore, the step of detecting the amplitude of the test signal, i.e., the detection signal, may include detecting the detection signal using a capacitive sensor positioned proximately near the electrical connection.

In summary, the present invention is advantageous because it (1) allows testing of an electrical connection's integrity without physically probing the electrical connection, (2) allows testing of an electrical connection's integrity without probing a signal path connected to the electrical connection, (3) reduces the required number of test point access nodes on the printed circuit assembly when attempting to test for electrical connection integrity, and (4) allows testing of a device's electrical connections where there is only one device on the printed circuit assembly implementing Boundary Scan and that device is surrounded by other devices that do not implement or support Boundary Scan testing. These and other features, advantages, and aspects of the present invention may be more clearly understood and appreciated from a review of the following detailed description of the disclosed embodiments and by reference to the appended drawings and claims.

BRIEF DESCRIPTION OF THE DRAWINGS

FIG. 1 is a block diagram of a prior art system illustrative of boundary scan testing.

FIG. 2 is a diagram of a prior art system implementing capacitive testing for detecting open pins or shorted pins on a device.

FIG. 3 is a diagram illustrating an apparatus for testing the integrity of an electrical connection without having access to the electrical connection.

FIG. 4 is a more detailed diagram illustrating an apparatus for testing the integrity of an electrical connection without having access to the electrical connection.

FIG. 5 is a flow diagram illustrating the preferred steps for testing the integrity of an electrical connection on a device using an onboard controllable signal source.

DETAILED DESCRIPTION OF THE INVENTION

The present invention is directed to systems and a method for testing the integrity of an electrical connection mounted on a circuit assembly using an onboard controllable signal source. In general, the integrity of the electrical connection is determined by whether the electrical connector, such as a pin or solder pad, is properly connected to an electrical signal path on the circuit assembly. For example, the electrical connector may be properly soldered to the signal path or wire trace on the circuit assembly, i.e., a good electrical connection. However, an improperly soldered electrical connector may result in an open circuit or a short circuit on the printed circuit assembly on the device, i.e., a bad electrical connection. Use of the improved apparatus and improved method of the present invention allows for detection of a bad electrical connection, even when there is no probe access to the connection itself or to a signal path related to the connection.

Referring now to FIGS. 3 through 5, in which like numerals represent like elements throughout the several figures, the preferred embodiment, and the various aspects of the present invention are described.

FIG. 3 is a diagram illustrating an apparatus for testing the integrity of an electrical connection without having access to the electrical connection. The apparatus includes an onboard controllable signal source 300, an electrical signal path 305, an electrical connector 225 (such as a pin or solder pad) of the device 205 that is mounted on a printed circuit board 210, all which are part of a printed circuit assembly 200, and a capacitive sensor 215 near the electrical connection 222.

The controllable signal source 300 is mounted to the printed circuit assembly 200, also called a circuit assembly. Typically, the controllable signal source 300 is an integrated circuit (such as a microprocessor) or an oscillator (such as a voltage controlled oscillator). A key characteristic of the controllable signal source 300 is that it is capable of generating or providing a test signal on a test signal output 310 of the controllable signal source 300. In the preferred embodiment, the controllable signal source 300 is a microprocessor, such as a conventional microcontroller, or a field programmable gate array (FPGA). The implementation of the microcontroller or field programmable gate array is unimportant except that it can be stimulated to generate the test signal at a selectable frequency on an output. Ideally, the microcontroller or field programmable gate array could function as the controllable signal source 300 during the test on the electrical connection 222 and then be re-programmed after the connection test to operate as another part of the circuit assembly 200 during normal operation.

While the preferred controllable signal source 300 can select the frequency of the test signal, the controllable signal source 300 may be a fixed frequency device whereby the fixed frequency is not harmonically related to the frequency of any other signal of the device 205.

In another embodiment, the controllable signal source 300 is an IC which supports Boundary Scan and can therefore generate the test signal at a selectable frequency. The IC could function as the controllable signal source 300 during the test on the electrical connection 222 and then operate as another part of the circuit assembly during normal operation. However, the present invention contemplates that the controllable signal source 300 could be a circuit or other electronic device that does not support Boundary Scan.

The test signal output lead 310 of the controllable signal source 300 is connected to the electrical signal path 305 via the connection 312, which is then connected to the electrical connector 225 of the device 205 via another connection 222. Thus, the test signal can be applied to the electrical connection 222 even though the signal path 305 is inaccessible to a test probe. If the output of the source 300 on the test signal output lead 310 is not used in normal operation, then the output of the source 300 on the test signal output lead 310 is preferably open during normal operation.

While only one electrical signal path 305 is shown, typically, there will be multiple signal paths 305. The number of signal paths 305 will be limited only by how many signal paths 305 can be physically brought from the onboard controllable signal source 300 to the device 205 and how many pins each device has.

In the embodiment illustrated, the capacitive sensor 215 is placed or positioned proximately near the electrical connector 225 (e.g., the pin) to be tested on the device 205 so that the connection 222 and the pin 225 are between the sensor 215 and the signal source 300. Capacitive sensors are well-known in the art. As previously stated, a capacitive sensor detects the amplitude of any AC signal in close proximity to the sense plate (electrode) (not shown) on the bottom of the capacitive sensor and converts the AC signal to an intermediate signal called a detection signal. The value of the detection signal is proportional to the detected amplitude of the AC signal. In this manner, the value of the detection signal from the capacitive sensor 215 may be compared to a threshold value to determine characteristics about the detected AC signal (such as the strength of the AC signal). In the preferred embodiment, the capacitive sensor 215 is preferably the capacitive sensor (i.e., the electrode and current measuring device) described in the '953 patent, which is hereby incorporated herein by reference.

Placing the capacitive sensor 215 "proximately near" the electrical connector 225 means that the capacitive sensor 215 is near enough to the device 205 to detect energy coupled into the device 205 via the electrical connection 222 and the pin 225. In an exemplary embodiment, the capacitive sensor 215 is placed as close as possible to the top of the device 205 and near the electrical connector 225 in order to achieve the best coupling and, thus, provide a more accurate indication of the integrity of the electrical connection 222.

The capacitive sensor 225 is positioned over the device 205.

The onboard controllable signal source 300 generates the test signal at the selectable frequency, for example 10 kHz. In the preferred embodiment, the selectable frequency is selected to be harmonically unrelated to the frequency of any other signal associated with the device 205. This advantageously prevents spurious signals from being falsely characterized as the coupled test signal.

The controllable signal source 300 provides the test signal on its test signal output 310 lead to the electrical signal path 305. The electrical signal path 305 provides an electrical conduit by which the test signal is applied to the electrical connector 225 on the device 205 via the connection 222. The capacitive sensor 215 detects the energy from the test signal which has been coupled through the electrical connection 222. If the detected energy is greater than a threshold, then the integrity of the electrical connection 222 is acceptable, i.e., the electrical connector 225 (pin) is properly soldered (connection 222) to the signal path 305 (wire trace). Otherwise, the integrity of the electrical connection 222 is not acceptable because an open connection, short, or faulty solder joint may exist with the electrical connection 222.

Furthermore, the integrity of any other electrical connection, such as the connection 312 between the test signal output lead 310 of the source 300 and the signal path 305, is inherently tested in this manner. For example, the test signal is sensed above one end of a connection chain made up of the connection 312 between the test output lead 310 and the signal path 305 and the connection 222 between the signal path 305 and the electrical connector 225 on the device 205. In this manner, the integrity of all intervening connections between the source 300 and the device 205 is conveniently and easily determined. This is especially useful when the source 300 is a ball grid array type of device (a surface mount type of device attached to the printed circuit board 210 using an array of solder balls beneath the device).

Additionally, this is useful when attempting to determine the integrity of a connection to a device when the device has a grounded heat spreader (not shown) mounted on top of the device. Those skilled in the art will be familiar with grounded heat spreaders. The use of grounded heat spreaders is known to help dissipate heat from the die within the device. Additionally, grounded heat spreaders provide a level of electromagnetic shielding to prevent stray electronic noise from infiltrating into other devices and coupling onto signal paths on the circuit assembly. If the source 300 has a grounded heat spreader, the integrity of the connection 312 between the source's test output lead 310 and the signal path 305 can advantageously be determined by sensing the test signal at an earlier point in the "connection chain" (e.g., above the connection 222 between the signal path 305 and the electrical connector 225 on the device 205). In the prior art, such a determination was not possible.

For example, if the source 300 is a ball grid array type of device having a grounded heat spreader, it is difficult to capacitively sense any kind of test signal applied to any lead of the source 300. This is quite problematic in the prior art. According to an embodiment of the present invention, the connections to the source 300 can be tested by commanding the source 300 to generate a test signal out of the test output lead 310. If the connection 312 is properly made to connect the test output 310 to the signal path 305, a sensor 215 can detect an adequate level of the test signal further down the connection chain (e.g., proximately near the device 205, the signal path 305, the connection 222, or any other connection in between the source 300 and the device 205).

FIG. 4 is a more detailed diagram illustrating an apparatus for testing the integrity of an electrical connection without having access to the electrical connection. The additional detail shown in FIG. 4 when compared to FIG. 3 includes conventional features known to those skilled in the art of in-circuit testing, such as a programmable controller, a Boundary Scan controller, and a bed of nails fixture.

Referring now to FIG. 4, the capacitive sensor 215 is part of a sensor assembly 400 and is connected to a programmable controller 405. The programmable controller 405 is operative to receive a detection signal 402 from the sensor 215 and compare the detected levels of the test signal (via the value of the detection signal 402 from the sensor 215) to a threshold value. In the preferred embodiment, the programmable controller 405 is a computer that controls a conventional in-circuit test system and is capable of controlling and positioning the capacitive sensor 215 with respect to the populated printed circuit assembly 200.

While only a single capacitive sensor 215 is illustrated, the present invention contemplates using a group of sensors (not shown) with the illustrated capacitive sensor 215 being a selected one of the group of sensors. In this manner, the programmable controller 405 is capable of selecting the particular capacitive sensor 215 necessary to determine the integrity of particular electrical connections on the circuit assembly 200.

The programmable controller 405 is capable of controlling the onboard controllable signal source 300 preferably through the use of a boundary scan controller 410 and a test fixture 430. The boundary scan controller 410 is essentially an interface circuit responsive to commands from the programmable controller 405. The boundary scan controller 410 receives commands from the programmable controller 405 on a controller input 415 and, in response, is operative to provide a control signal on a controller output 420. The controller output 420 is connected to the contact probe 435 of the test fixture 420. The signal source 300 has an input/control lead (or leads) 440 which is connected to a contact pad or test point 438 via an electrical connector 439. The probe 435 contacts the test point 438. Those skilled in the art will quickly realize that such a single contact pad 438 is sufficient if the control signal is formatted as a serial data stream. Although not illustrated, the present invention contemplates using two or more contact pads or test points 438 so that a parallel data formatted control signal may be utilized. In FIG. 4, four pins are assumed because Boundary Scan requires four pins, but only one pin is illustrated.

The control signal is applied to the control input 440 of the controllable signal source 300, preferably through the contact probe 435, the pad 438, and the connector 439. In this manner, the programmable controller 405 is operative to initiate generation of the test signal as well as to control selection of the frequency of the test signal. In another embodiment, the controllable signal source 300 has multiple output pins and, in response to the control signal, the programmable controller 405 is operative to select the particular output pin on which to apply the test signal. In the preferred embodiment, the frequency of the test signal is most easily selected using a command which toggles the Boundary Scan pin TCLK. The clock frequency applied to the TCLK pin sets the frequency at which the level of the test signal is alternated between a low level and a high level.

One skilled in the art will realize that the test fixture 430, the boundary scan controller 410, and the sensor assembly 400 are preferably part of a conventional in-circuit test system used to test populated printed circuit assemblies, such as the printed circuit assembly 200 illustrated in FIGS. 3 and 4.

Still referring to FIG. 4, the operation of the more detailed embodiment of the present invention will be described. The capacitive sensor 215 is positioned over the electrical connector 225 on the device 205. In an exemplary embodiment, the capacitive sensor is rigidly fixed in a position with regard to the electrical connector 225 on the device 205. However, in an alternative embodiment, the capacitive sensor 215 can be robotically positioned at the desired location in response to the programmable controller's 405 commands.

The programmable controller 405 sends a command to the boundary scan controller 410 in order to cause the boundary scan controller 410 to generate the control signal at its control output 420. The control signal is then applied to the control input 440 of the onboard controllable signal source 300. In the preferred embodiment, the onboard controllable signal source 300 supports Boundary Scan, thus allowing the boundary scan controller 410 to control the onboard controllable signal source 300 in accordance with the IEEE 1149.1 standard.

In response to the applied control signal, the onboard controllable signal source 300 generates the test signal at the selectable frequency, such as 10 kHz. The controllable signal source 300 provides the test signal on its test signal output lead 310 to the electrical signal path 305. The test signal output lead 310 is connected to the signal path 305 via the electrical connection 312. In the preferred embodiment, the onboard controllable signal source 300 has multiple output leads 310 and the control signal specifies the output leads on which test signals will appear. In this manner, the output lead or pin may be selected.

In the preferred embodiment, the routing of the test signal to the electrical connection is implemented by various wire traces (more generally called electrical signal paths 305) leading to different electrical connections on the device. These wire traces are inherent in the layout pattern on the printed circuit board 210. In this manner, a single controllable signal source 300 is able to advantageously stimulate each of the electrical connections to the device 205, as opposed to requiring a separate dedicated signal source for each electrical connection.

Once the test signal is provided to the electrical connection 222, the capacitive sensor 215 detects the energy from the test signal coupling through the electrical connection 222. In the preferred embodiment, the capacitive sensor 215 detects the amplitude of the test signal coupled to the electrical connector 225 via the connection 222. The detection signal 402 provided by the capacitive sensor 215 indicates the value of the detected amplitude of the coupled test signal. The capacitive sensor 215 provides the detection signal 402 to the programmable controller 405.

In response to receiving the detection signal 402, the programmable controller 405 compares the detected level of the test signal to a threshold value, typically 10 dB below the nominal detected level of the test signal when the connection 222 is intact. This is preferably accomplished by comparing the value of the detection signal to the threshold value. The comparison of the detected value of the coupled test signal to the threshold value indicates the integrity of the electrical connection, i.e., whether the electrical connector 225 (pin) is properly soldered to the signal path 305 (wire trace) at connection 222. If the signal path 305 includes one or more interconnected components (not shown), such as resistors, capacitors, filters, transistors, or other types of electrical components or ICs through which the test signal may propagate, the comparison of the detected value to the threshold value also indicates the integrity of such interconnected components.

In a typical example using transistor-transistor logic (TTL) type of devices, the test signal is applied to the signal path 305 at a frequency of 10 kHz and a voltage amplitude of 4 volts. Prior to generating the test signal, the value of the detection signal from the capacitive sensor 215 is typically −130 dBv at 10 kHz. If the integrity of the electrical connection 222 is acceptable, the value of the detection signal (the detected value of the coupled test signal) from the capacitive sensor 215 is typically −80 dBv once the test signal is applied. However, when the test signal is applied and the electrical connection 222 is open, the value of the detection signal is typically 10 to 20 dB below the nominal −80 dBv value.

It is important to note that the actual amount of signal drop due to the faulty connection 222 depends on the type of device 205 being tested, the type of IC packaging (such as quad flat packs, ball grid arrays, pin grid arrays, edge connectors, etc.), the capacitance of the electrical connection 222 and/or the connector 225, the type of fault (open, short, etc.), and the location of the fault. Thus, the integrity of the electrical connection 222, such as between the signal path 305 and a pin or a solder pad 225, may be tested using an onboard controllable signal source 300 even when the signal path 305 and the electrical connection 222 are inaccessible by a test probe.

Note that this procedure tests the entire signal path: from the controller 405 to the Boundary Scan controller 410; from the Boundary Scan controller 410 to the probe 435; from the probe 435 to the control input 440 of the signal source 300 via the contact pad 438 and the connector 439; from the signal source 300 to the device 205 via the output lead 310, the connection 312, the signal path 305, another connection 222, and the lead 225 of the device 205; the internal connection and signal path of the device 205; the sensor 215; and the test output signal 402 back to the controller 405. Thus, the test equipment, the test interface, and the printed circuit assembly are all tested for proper connection between them. For convenience of illustration, only a single-sided assembly 200 is shown. However, the present invention contemplates testing two-sided assemblies 200, in which case the sensor 215 would be positioned similarly with respect to a device 205' on the other side of the assembly 200.

In another embodiment, the capacitive sensor 215 may be positioned proximately near the signal path 305 as opposed to being positioned near the device 205. In this manner, the integrity of the connection 312 between the onboard controllable signal source 300 and the signal path 305 may be determined as described above, i.e., by comparing the value of the detection signal to the threshold value. This is particularly useful when the onboard controllable signal source 300 is in fact a device used in the normal operation of the circuit assembly 200.

FIG. 5 is a flow diagram illustrating the preferred steps for testing the integrity of an electrical connection on a device using an onboard controllable signal source. Referring now to FIG. 5, the method 500 begins at step 505 where the capacitive sensor 215 is positioned proximately near the electrical connection 222.

At step 510, a control signal is provided to and received by the controllable signal source 300. The control signal is preferably generated by the boundary scan controller 410 in response to a command sent from the programmable controller 405. The control signal is routed to the control input 440 of the controllable signal source 300 using the test fixture's 430 contact probe 435. While the control signal is provided via a contact probe in the preferred embodiment, the present invention is not limited to stimulating and controlling the controllable signal source 300 by physically probing the printed circuit assembly 200. For example, another device on the printed circuit assembly 200 may control or stimulate the controllable signal source 300.

At step 515, the frequency of the test signal is selected. The selected frequency is preferably chosen to be harmonically unrelated to the frequency of any other signal associated with the device 205. For example, if the controllable signal source 300 is a microprocessor, the microprocessor may control the frequency of a square wave on the test signal output 310.

At step 520, the controllable signal source 300 generates the test signal at the selected frequency in response to receiving the control signal. At step 525, the test signal is applied to the electrical connector 225 on the device 205. This is accomplished by routing the test signal through the signal path 305, the connection 222, and the lead or pin 225, without having to probe the signal path 305.

Once the test signal is applied to the electrical connector 225, the amplitude of the test signal is detected at step 530. In other words, the capacitive sensor 215 detects the amplitude of the energy of the test signal.

At step 535, the capacitive sensor 215 provides the detected amplitude of the test signal, preferably as a detection signal, to the programmable controller 405. The programmable controller then compares the value of the detected amplitude to a threshold value. In the preferred embodiment, the threshold value is set to 10 dB below the nominal detected level of the test signal when the connection 222 is intact. It is important to understand the actual threshold value may change for different logic families and different connection configurations.

At step 540, if the value of the detected amplitude of the test signal is greater than the predetermined threshold value, step 540 proceeds to step 545 where an indication is made that the integrity of the electrical connection 222 is acceptable. Otherwise, step 540 proceeds directly to step 550 where an indication is made that the integrity of the electrical connection 222 is unacceptable because the electrical connection 222 may be open or have a faulty solder joint. After steps 545 and 550, the testing process 500 may end or a return may be made to step 505 to begin testing the next connection.

In summary, the above-described method and apparatus advantageously allow testing and determining the integrity of the electrical connection 222 using an onboard controllable signal source 300 without having to probe the electrical connections 312, 222 or the electrical signal path 305 connected to the electrical connectors 310, 225.

From the foregoing description, it will be appreciated that the present invention provides improved apparatus and an improved method for testing the integrity of an electrical connection to a device mounted on a printed circuit assembly using an onboard controllable signal source. The foregoing systems and method may be conveniently implemented based upon the figures and accompanying description herein. The present invention has been described by particular embodiments which are illustrative rather than restrictive. Those skilled in the art will understand that the principles of the present invention apply to any apparatus or processes that must efficiently test the integrity of an electrical connection.

Alternative embodiments will become apparent to those skilled in the art to which the present invention pertains without departing from its spirit and scope. Accordingly, the scope of the present invention is defined by the appended claims.

What is claimed is:

1. An improvement to an apparatus for testing the integrity of an electrical connection between an electrical signal path and a device, said electrical signal path and said device being on a circuit assembly, said improvement comprising:

an onboard controllable signal source, included on said circuit assembly, and responsive to a control signal for providing an output test signal to said electrical signal path; and a sensor assembly for detecting said output test signal proximately near said device and for determining said integrity of said electrical connection by comparing said output test signal detected proximately near said device to a threshold value, said sensor assembly being distinct from said circuit assembly.

2. The apparatus of claim 1, wherein said onboard controllable signal source is further operative to generate said output test signal to be harmonically unrelated to a frequency of any other signal associated with said device.

3. The apparatus of claim 1, wherein said onboard controllable signal source comprises a microprocessor capable of generating said output test signal.

4. An improvement to an apparatus for testing the integrity of an electrical connection between an electrical signal path and a device, said electrical signal path and said device being on a circuit assembly, said improvement comprising:

an onboard controllable signal source, included on said circuit assembly and responsive to a control signal for providing an output test signal at a selectable frequency to said electrical signal path, the value of said selectable frequency being harmonically unrelated to a frequency of any other signal associated with said device;

a sensor, distinct from said circuit assembly, for detecting said output test signal while being proximately near said device and for providing a detection signal representative of said detected output test signal; and a controller, connected to said sensor and distinct from said circuit assembly, for determining said integrity of said electrical connection by comparing said detection signal to a threshold value.

5. The apparatus of claim 4, wherein said onboard controllable signal source is a microprocessor capable of generating said output test signal at said selectable frequency.

6. The apparatus of claim 4, wherein said onboard controllable signal source is further responsive to said control signal to generate said output test signal at a predetermined amplitude; and wherein said sensor is further operative to provide said detection signal indicating a detected amplitude of said output test signal.

7. The apparatus of claim 4, wherein said electrical signal path comprises a plurality of interconnected components through which said output test signal propagates; and wherein said controller is further operative to determine the integrity of said interconnected components within said electrical signal path by comparing said detection signal to said threshold value.

8. An improvement to an apparatus for testing the integrity of a plurality of electrical connections on a circuit assembly comprising at least one component with a grounded heat sink, wherein said component is suitable for use as an onboard controllable signal source, said improvement comprising:

the onboard controllable signal source, included on said circuit assembly and responsive to a control signal for providing an output test signal at a selectable frequency on an electrical signal path to a device on said circuit assembly, said onboard controllable signal source being connected to said electrical signal path by a first of said electrical connections and said electrical signal path being connected to said device by a second of said electrical connections, the value of said selectable frequency being harmonically unrelated to a frequency of any other signal associated with said device;

a sensor, distinct from said circuit assembly, for detecting said output test signal while being proximately near a selected one of said second of the electrical connections, said electrical signal path, and said device, and for providing a detection signal representative of said detected output test signal; and a controller, connected to said sensor and distinct from said circuit assembly, for determining said integrity of the first of the electrical connections between said electrical signal path and said onboard controllable signal source by comparing said detection signal to a threshold value.

9. The apparatus of claim 8, wherein said onboard controllable signal source is attached to said circuit assembly using a ball grid array.

10. An improved method for testing the integrity of an electrical connection between an electrical signal path and a device, said electrical signal path and said device being on a circuit assembly, said improved method comprising the steps of:

providing a control signal to an onboard controllable signal source mounted on said circuit assembly;

generating an output test signal having a selectable frequency in response to said control signal, the value of said selectable frequency being harmonically unrelated to a frequency of any other signal associated with said device;

applying said output test signal from said onboard controllable signal source to said electrical connection without probing said electrical signal path between said onboard controllable signal source and said electrical connection;

detecting the amplitude of said output test signal proximately near said device;

providing said amplitude of said output test signal as a detection signal to a controller; and comparing said detection signal to a threshold value to determine the integrity of said electrical connection.

11. The method of claim 10 and, prior to said generating step, further comprising the step of selecting said selectable frequency to be unrelated to the frequency of any other signals associated with said device.

12. The method of claim 10 and, prior to said generating step, further comprising the step of selecting one of a plurality of output pins of said onboard controllable signal source on which to generate said output test signal.

13. The method of claim 12 and, prior to said detecting step, further comprising the step of selecting one of a plurality of sensors with which to detect said output test signal.

14. A printed circuit assembly, comprising:

a printed circuit board (PCB);

a device mounted to said PCB;

a signal path to said device;

an electrical connection connecting said signal path to said device; and an onboard controllable signal source, mounted to said PCB and connected to said signal path, responsive to a control signal for generating an output test signal and applying said output test signal to said signal path.

15. The printed circuit assembly of claim 14, wherein said onboard controllable signal source is further responsive to said control signal for selecting the frequency of said output test signal.

16. The printed circuit assembly of claim 15, wherein said onboard controllable signal source is further responsive to said control signal for selecting the frequency of said output test signal to be harmonically unrelated to the frequency of any other signal associated with said device.

17. The printed circuit assembly of claim 14, wherein said onboard controllable signal source has an output for providing said output test signal and said onboard controllable signal source is further responsive to said control signal for placing said output in an open circuit condition.

18. A test assembly for testing a connection to a device on a printed circuit assembly, comprising:
- a controlling means for generating a control signal, said control signal containing instructions as to the generation of an output test signal within said printed circuit assembly;
- a probing means for providing said control signal to an onboard controllable signal source mounted to said printed circuit assembly;
- a sensing means for detecting the amplitude of said output test signal on said printed circuit assembly proximately near said device; and
- a comparing means for evaluating said amplitude to determine the integrity of said connection.

19. An improvement to an apparatus for testing the integrity of an electrical connection between an onboard controllable signal source and an electrical signal path, said electrical signal path and said onboard controllable signal source being on a circuit assembly, said improvement comprising:
- said onboard controllable signal source being responsive to a control signal for providing an output test signal at a selectable frequency to said electrical signal path;
- a sensor, distinct from said circuit assembly, for detecting said output test signal while being proximately near said electrical signal path and for providing a detection signal representative of said detected output test signal; and
- a controller, connected to said sensor and distinct from said circuit assembly, for providing said control signal to said onboard controllable signal source and determining said integrity of said electrical connection by comparing said detection signal to a threshold value.

* * * * *